(12) United States Patent  (10) Patent No.: US 7,705,475 B2
Jeon et al. (45) Date of Patent: Apr. 27, 2010

(54) INTEGRATED CIRCUIT PACKAGE SYSTEM

(75) Inventors: Hyung Jun Jeon, Seoul (KR); Tae Keun Lee, Ichon-si (KR); Sung Soo Kim, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 806 days.

(21) Appl. No.: 11/462,303

(22) Filed: Aug. 3, 2006

(65) Prior Publication Data

US 2008/0029911 A1   Feb. 7, 2008

(51) Int. Cl.
*H01L 23/28* (2006.01)
(52) U.S. Cl. .............. 257/787; 257/685; 257/687; 257/E23.004
(58) Field of Classification Search ......... 257/787–796, 257/685, 687, E23.004
See application file for complete search history.

(56) References Cited

U.S. PATENT DOCUMENTS

| 5,617,297 | A | 4/1997 | Lo et al. |
| 6,976,111 | B1 | 12/2005 | Mills et al. |
| 6,988,668 | B2 | 1/2006 | Osako et al. |
| 7,053,471 | B2 | 5/2006 | Wada et al. |
| 7,055,757 | B2 | 6/2006 | Nishizawa et al. |
| 7,092,308 | B2 * | 8/2006 | Choi et al. ........... 365/226 |
| 7,291,903 | B2 * | 11/2007 | Nishizawa et al. ....... 257/679 |

* cited by examiner

*Primary Examiner*—Leonardo Andújar
(74) *Attorney, Agent, or Firm*—Mikio Ishimaru

(57) ABSTRACT

An integrated circuit package system is provided including forming a substrate with a device thereover, forming an encapsulation having a planar top surface to cover the device and the substrate spanning to an extraction side of the encapsulation, and forming a recess in the encapsulation from the planar top surface.

8 Claims, 2 Drawing Sheets

INTEGRATED CIRCUIT PACKAGE SYSTEM

TECHNICAL FIELD

The present invention relates generally to integrated circuit packages and more particularly to molded integrated circuit packages.

BACKGROUND ART

Modern electronics, such as smart phones, personal digital assistants, location based services devices, enterprise class servers, or enterprise class storage arrays, are packing more integrated circuits into an ever shrinking physical space with expectations for decreasing cost. Contemporary electronics expose integrated circuits and packages to more demanding and sometimes new environmental conditions, such as cold, heat, humidity, and everyday handling requiring integrated circuit packages to provide robust structures.

Electronic appliances also provide flexibility provide modular support for consumers to customize features important to them. This flexibility requires robust, durable, and ergonomically usable form factors of these modules. These modules may provide various functions such as providing connectivity for wireless access to storing digital pictures.

Numerous technologies have been developed to meet these requirements. Some of the research and development strategies focus on new technologies while others focus on improving the existing and mature technologies. Research and development in the existing technologies may take a myriad of different directions.

One proven way to reduce cost is to use mature package technologies with existing manufacturing methods and equipments. Existing packaging technologies struggle to cost effectively meet the ever demanding reliability, durability, and usability requirements of today's integrated circuits and packages.

Most integrated circuit devices use molded compound as an epoxy mold compound (EMC) for protecting package. The encapsulation formed from the molding compound and other packaging structures tend to increase the size or format factor of the overall package. Other usability structures add more complexity and may increase the size or decrease the durability of the overall package structure. These additional structures may also limit how many modules may be simultaneously used within the physical constraints available in the electronic appliance.

Thus, a need still remains for an integrated circuit package system providing low cost manufacturing, improved usability, and improved durability for the integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a substrate with a device thereover, forming an encapsulation having a planar top surface to cover the device and the substrate spanning to an extraction side of the encapsulation, and forming a recess in the encapsulation from the planar top surface.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
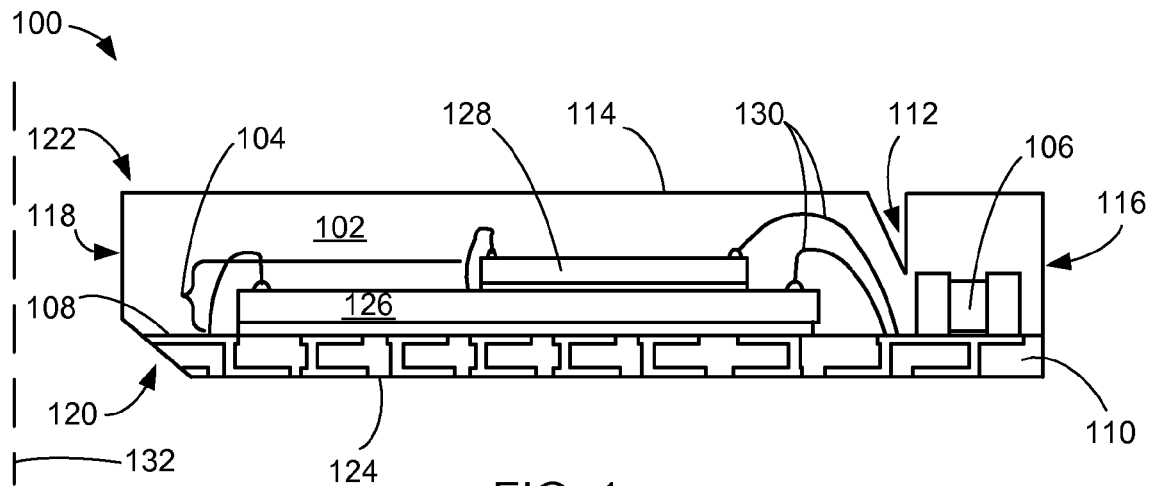
FIG. 1 is a cross-sectional view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a cross-sectional view of an integrated circuit package system 100 in an embodiment of the present invention. The integrated circuit package system 100 may be a module, such as an expansion card or a pluggable card, used in an electronic system 132 depicted as a dotted line, such as hand held electronic appliance or an enterprise class server system. The integrated circuit package system 100 may provide a number of different functions or a combination of functions, such as providing connectivity for wireless access, additional storage, or identity information. The integrated circuit package system 100 has an encapsulation 102, such as an epoxy mold compound (EMC) or resin mold, covering a first device 104, and a second device 106 with both connected to a first surface 108 of a substrate 110.

For illustrative purpose, the integrated circuit package system 100 is described having the first device 104 and the second device 106, although it is understood that the integrated circuit package system 100 may not have any devices. As an example, the integrated circuit package system 100 may be a placeholder module without a device therein. Also for illustrative purposes, the integrated circuit package system 100 is shown having the substrate 110, although it is understood that the integrated circuit package system 100 may not have the substrate 110. Similarly, the placeholder module without a device is not required to have the substrate 110.

The encapsulation 102 has a recess 112, such as a chamfered cut, on a planar top surface 114 of the encapsulation 102 between the first device 104 and the second device 106. The recess 112 does not prohibit having any number of devices, such as the first device 104 or the second device 106, on either side of the recess 112. The recess 112 is closer to an extraction side 116 of the integrated circuit package system 100. The recess 112 may assist in the removal or withdraw of the integrated circuit package system 100 from the electronic system, or may be used generally to provide a grip for general handling. For illustrative purposes, the recess 112 has devices on both sides, although it is understood that the recess 112 may not have a device or devices on both sides.

An insertion side 118 of the integrated circuit package system 100 has a nonorthogonal lower segment 120 of the substrate 110 and the encapsulation 102. The insertion side 118 also has an upper corner segment 122 of the encapsulation 102. The nonorthogonal lower segment 120 may expose contacts (not shown) on a second surface 124 of the substrate 110. The contacts electrically connect the integrated circuit package system 100 and the electronic system. The nonorthogonal lower segment 120 may also help direct the integrated circuit package system 100 during insertion into, as well as mating with, the electronic system.

The first device 104 may be a stack of integrated circuits, such as a first integrated circuit die 126 below a second integrated circuit die 128, and connected to the substrate 110 with internal interconnects 130, such as bond wires. The second device 106 may be a passive component. The substrate 110 spans from approximate the insertion side 118 to the extraction side 116. The substrate 110 helps provide planar rigidity to the integrated circuit package system 100 as well as electrical connectivity.

For illustrative purpose, the first device 104 is shown as a stack of the first integrated circuit die 126 and the second integrated circuit die 128, although it is understood that the first device 104 may be a different configuration with different types, such as components or prepackaged devices. Also for illustrative purposes, the first integrated circuit die 126 and the second integrated circuit die 128 are shown as wire bonded to the substrate 110, although it is understood that the first integrated circuit die 126 and the second integrated circuit die 128 may be have different electrical connectivity, such as solder bumps for flip chip. Further for illustrative purposes, the second device 106 is shown as a passive component, although it is understood that the second device 106 may not be a passive component.

Figure 2:
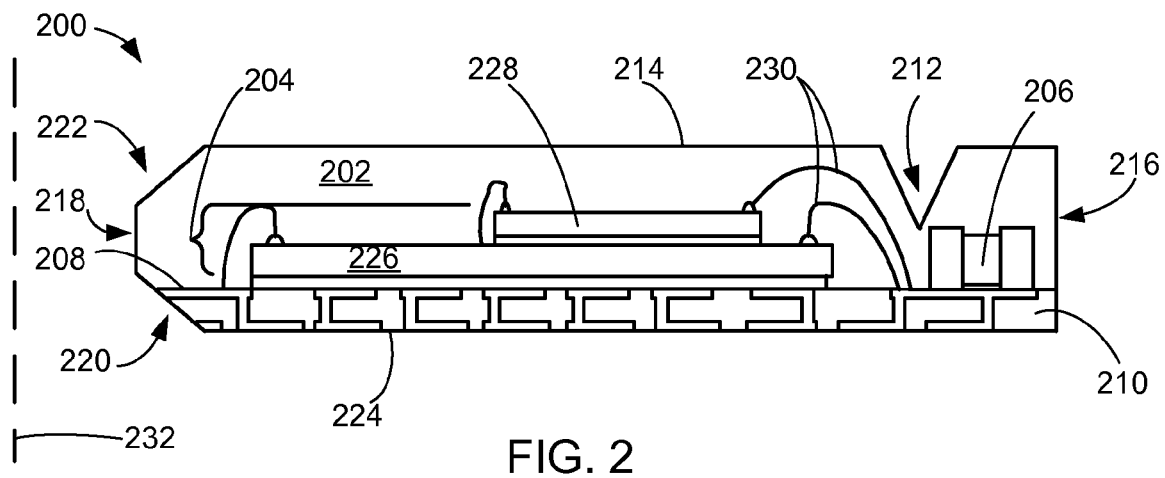
FIG. 2 is a cross-sectional view of an integrated circuit package system in an alternative embodiment of the present invention.

Referring now to FIG. 2, therein is shown a cross-sectional view of an integrated circuit package system 200 in an alternative embodiment of the present invention. The integrated circuit package system 200 may be a module, such as an expansion card or a pluggable card, used in an electronic system 232 depicted as a dotted line, such as hand held electronic appliance or an enterprise class server system. The integrated circuit package system 200 may provide a number of different functions or a combination of functions, such as providing connectivity for wireless access, additional storage, or identity information. The integrated circuit package system 200 has an encapsulation 202, such as an epoxy mold compound (EMC) or resin mold, covering a first device 204, and a second device 206 with both connected to a first surface 208 of a substrate 210.

For illustrative purpose, the integrated circuit package system 200 is described having the first device 204 and the second device 206, although it is understood that the integrated circuit package system 200 may not have any devices. As an example, the integrated circuit package system 200 may be a placeholder module without a device therein. Also for illustrative purposes, the integrated circuit package system 200 is shown having the substrate 210, although it is understood that the integrated circuit package system 200 may not have the substrate 210. Similarly, the placeholder module without a device is not required to have the substrate 210.

The encapsulation 202 has a recess 212, such as a groove, on a planar top surface 214 of the encapsulation 202 between the first device 204 and the second device 206. The recess 212 does not prohibit having any number of devices, such as the first device 204 or the second device 206, on either side of the recess 212. The recess 212 is closer to an extraction side 216 of the integrated circuit package system 200. The recess 212 may assist in the removal or withdraw of the integrated circuit package system 200 from the electronic system, or may be used generally to provide a grip for general handling. For illustrative purposes, the recess 212 has devices on both sides, although it is understood that the recess 212 may not have a device or devices on both sides.

An insertion side 218 of the integrated circuit package system 200 has a nonorthogonal lower segment 220 of the substrate 210 and the encapsulation 202. The insertion side 218 also has a nonorthogonal upper segment 222 of the encapsulation 202. The nonorthogonal lower segment 220 may expose contacts (not shown) on a second surface 224 of the substrate 210. The contacts electrically connect the integrated circuit package system 200 and the electronic system. The nonorthogonal lower segment 220 and the nonorthogonal upper segment 222 may also help direct the integrated circuit package system 200 during insertion into, as well as mating with, the electronic system.

The first device 204 may be a stack of integrated circuits, such as a first integrated circuit die 226 below a second integrated circuit die 228, and connected to the substrate 210 with internal interconnects 230, such as bond wires. The second device 206 may be a passive component. The substrate 210 spans from approximate the insertion side 218 to the extraction side 216. The substrate 210 helps provide planar rigidity to the integrated circuit package system 200 as well as electrical connectivity.

For illustrative purpose, the first device 204 is shown as a stack of the first integrated circuit die 226 and the second integrated circuit die 228, although it is understood that the first device 204 may be a different configuration with different types, such as components or prepackaged devices. Also for illustrative purposes, the first integrated circuit die 226 and the second integrated circuit die 228 are shown as wire bonded to the substrate 210, although it is understood that the first integrated circuit die 226 and the second integrated circuit die 228 may be have different electrical connectivity, such as solder bumps for flip chip. Further for illustrative purposes, the second device 206 is shown as a passive component, although it is understood that the second device 206 may not be a passive component.

Figure 3:
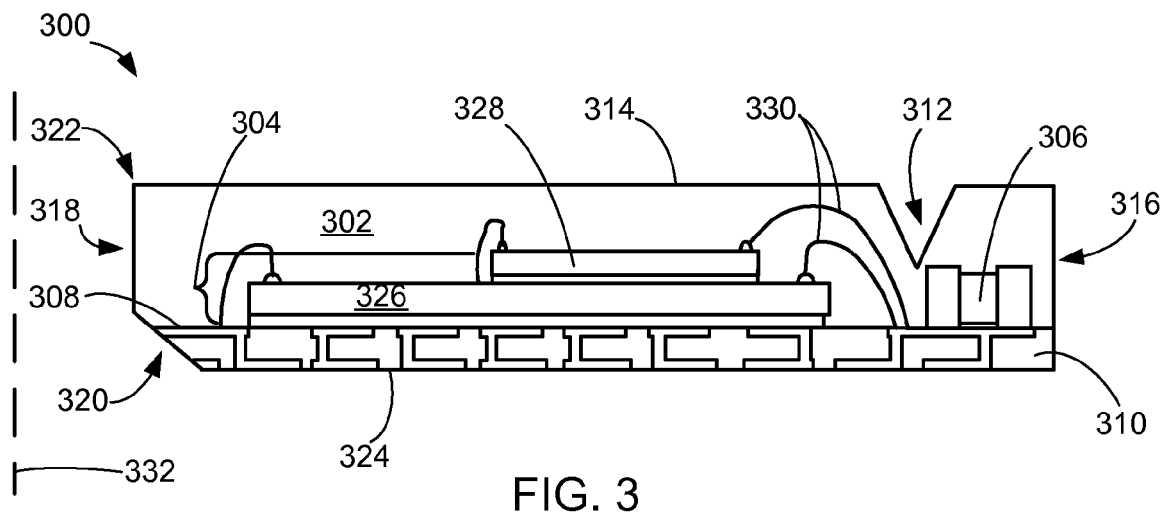
FIG. 3 is a cross-sectional view of an integrated circuit package system in another embodiment of the present invention.

Referring now to FIG. 3, therein is shown a cross-sectional view of an integrated circuit package system 300 in another embodiment of the present invention. The integrated circuit package system 300 may be a module, such as an expansion card or a pluggable card, used in an electronic system 332 depicted as a dotted line, such as hand held electronic appliance or an enterprise class server system. The integrated circuit package system 300 may provide a number of different functions or a combination of functions, such as providing connectivity for wireless access, additional storage, or identity information. The integrated circuit package system 300 has an encapsulation 302, such as an epoxy mold compound (EMC) or resin mold, covering a first device 304, and a second device 306 with both connected to a first surface 308 of a substrate 310.

For illustrative purpose, the integrated circuit package system 300 is described having the first device 304 and the second device 306, although it is understood that the integrated circuit package system 300 may not have any devices. As an example, the integrated circuit package system 300 may be a placeholder module without a device therein. Also for illustrative purposes, the integrated circuit package system 300 is shown having the substrate 310, although it is understood that the integrated circuit package system 300 may not have the substrate 310. Similarly, the placeholder module without a device is not required to have the substrate 310.

The encapsulation 302 has a recess 312, such as a chamfered cut, on a planar top surface 314 of the encapsulation 302 between the first device 304 and the second device 306. The recess 312 does not prohibit having any number of devices, such as the first device 304 or the second device 306, on either side of the recess 312. The recess 312 is closer to an extraction side 316 of the integrated circuit package system 300. The recess 312 may assist in the removal or withdraw of the integrated circuit package system 300 from the electronic system, or may be used generally to provide a grip for general handling. For illustrative purposes, the recess 312 has devices on both sides, although it is understood that the recess 312 may not have a device or devices on both sides.

An insertion side 318 of the integrated circuit package system 300 has a nonorthogonal lower segment 320 of the substrate 310 and the encapsulation 302. The insertion side 318 also has a nonorthogonal upper segment 322 of the encapsulation 302. The nonorthogonal lower segment 320 may expose contacts (not shown) on a second surface 324 of the substrate 310. The contacts electrically connect the integrated circuit package system 300 and the electronic system. The nonorthogonal lower segment 320 may also help direct the integrated circuit package system 300 during insertion into, as well as mating with, the electronic system.

The first device 304 may be a stack of integrated circuits, such as a first integrated circuit die 326 below a second integrated circuit die 328, and connected to the substrate 310 with internal interconnects 330, such as bond wires. The second device 306 may be a passive component. The substrate 310 spans from approximate the insertion side 318 to the extraction side 316. The substrate 310 helps provide planar rigidity to the integrated circuit package system 300 as well as electrical connectivity.

For illustrative purpose, the first device 304 is shown as a stack of the first integrated circuit die 326 and the second integrated circuit die 328, although it is understood that the first device 304 may be a different configuration with different types, such as components or prepackaged devices. Also for illustrative purposes, the first integrated circuit die 326 and the second integrated circuit die 328 are shown as wire bonded to the substrate 310, although it is understood that the first integrated circuit die 326 and the second integrated circuit die 328 may be have different electrical connectivity, such as solder bumps for flip chip. Further for illustrative purposes, the second device 306 is shown as a passive component, although it is understood that the second device 306 may not be a passive component.

Figure 4:
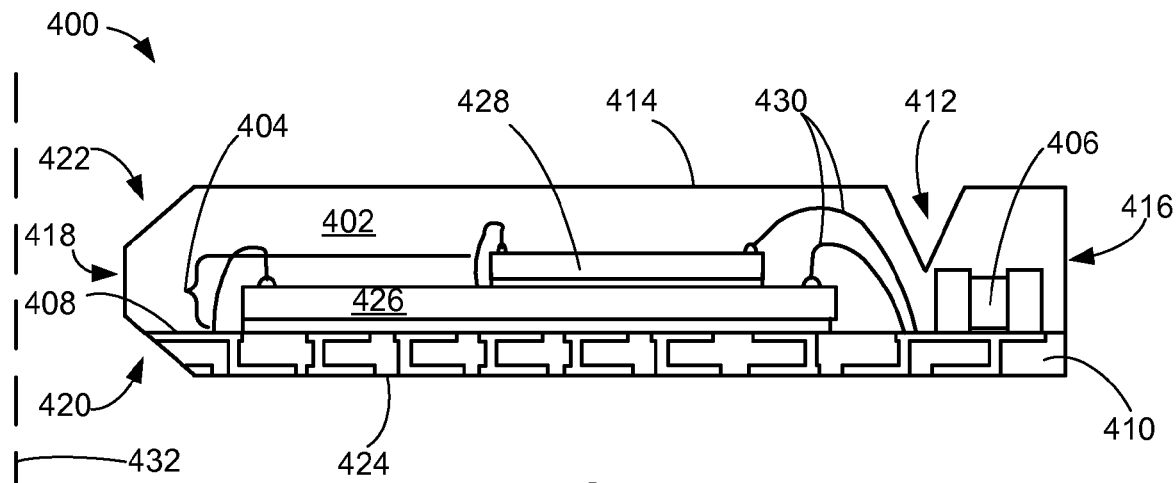
FIG. 4 is a cross-sectional view of an integrated circuit package system in yet another embodiment of the present invention.

Referring now to FIG. 4, therein is shown a cross-sectional view of an integrated circuit package system 400 in yet another embodiment of the present invention. The integrated circuit package system 400 may be a module, such as an expansion card or a pluggable card, used in an electronic system 432 depicted as a dotted line, such as hand held electronic appliance or an enterprise class server system. The integrated circuit package system 400 may provide a number of different functions or a combination of functions, such as providing connectivity for wireless access, additional storage, or identity information. The integrated circuit package system 400 has an encapsulation 402, such as an epoxy mold compound (EMC) or resin mold, covering a first device 404, and a second device 406 with both connected to a first surface 408 of a substrate 410.

For illustrative purpose, the integrated circuit package system 400 is described having the first device 404 and the second device 406, although it is understood that the integrated circuit package system 400 may not have any devices. As an example, the integrated circuit package system 400 may be a placeholder module without a device therein. Also for illustrative purposes, the integrated circuit package system 400 is shown having the substrate 410, although it is understood that the integrated circuit package system 400 may not have the substrate 410. Similarly, the placeholder module without a device is not required to have the substrate 410.

The encapsulation 402 has a recess 412, such as a groove, on a planar top surface 414 of the encapsulation 402 between the first device 404 and the second device 406. The recess 412 does not prohibit having any number of devices, such as the first device 404 or the second device 406, on either side of the recess 412. The recess 412 is closer to an extraction side 416 of the integrated circuit package system 400. The recess 412 may assist in the removal or withdraw of the integrated circuit package system 400 from the electronic system, or may be used generally to provide a grip for general handling. For illustrative purposes, the recess 412 has devices on both sides, although it is understood that the recess 412 may not have a device or devices on both sides.

An insertion side 418 of the integrated circuit package system 400 has a nonorthogonal lower segment 420 of the substrate 410 and the encapsulation 402. The insertion side 418 also has a nonorthogonal upper segment 422 of the encapsulation 402. The nonorthogonal lower segment 420 may expose contacts (not shown) on a second surface 424 of the substrate 410. The contacts electrically connect the integrated circuit package system 400 and the electronic system. The nonorthogonal lower segment 420 and the nonorthogonal upper segment 422 may also help direct the integrated circuit package system 400 during insertion into, as well as mating with, the electronic system.

The first device 404 may be a stack of integrated circuits, such as a first integrated circuit die 426 below a second integrated circuit die 428, and connected to the substrate 410 with internal interconnects 430, such as bond wires. The second device 406 may be a passive component. The substrate 410 spans from approximate the insertion side 418 to the extraction side 416. The substrate 410 helps provide planar rigidity to the integrated circuit package system 400 as well as electrical connectivity.

For illustrative purpose, the first device 404 is shown as a stack of the first integrated circuit die 426 and the second integrated circuit die 428, although it is understood that the first device 404 may be a different configuration with different types, such as components or prepackaged devices. Also for illustrative purposes, the first integrated circuit die 426 and the second integrated circuit die 428 are shown as wire bonded to the substrate 410, although it is understood that the first integrated circuit die 426 and the second integrated circuit die 428 may be have different electrical connectivity, such as solder bumps for flip chip. Further for illustrative purposes, the second device 406 is shown as a passive component, although it is understood that the second device 406 may not be a passive component.

Figure 5:
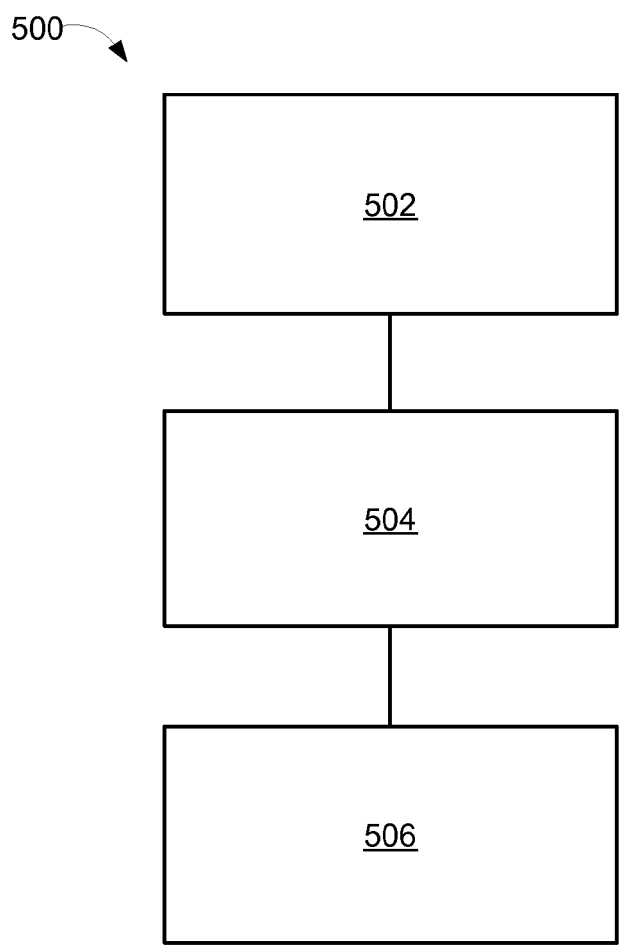
FIG. 5 is a flow chart of an integrated circuit package system for manufacture of the integrated circuit package system in an embodiment of the present invention.

Referring now to FIG. 5, therein is shown a flow chart of an integrated circuit package system 500 for manufacture of the integrated circuit package system 500 in an embodiment of the present invention. The system 500 includes forming a substrate with a device thereover in a block 502; forming an encapsulation having a planar top surface to cover the device and the substrate spanning to an extraction side of the encapsulation in a block 504; and forming a recess in the encapsulation from the planar top surface in a block 506.

It has been discovered that the present invention thus has numerous aspects.

It has been discovered that the present invention provides an integrated circuit package system for higher high device content integration, higher card density in an electronic system, improved durability for general use and handling, and improved contact reliability in the electronic system.

An aspect is that the present invention provides a recess at the extraction side of the integrated circuit package system. The recess is formed from the encapsulation that has a planar surface. The recess provides for the gripping function mitigating over exertion at the recess that may cause breakage that may more likely occur with grip structures not planar or not flat with the rest of the top surface of the encapsulation. The planar surface of the encapsulation also allows for a higher density of integrated circuit package system in the electronic system.

Another aspect of the present invention provides methods for forming the recess, such as a chamfered cut or a groove, using low cost manufacturing. The recess may be formed by angled blade cut of the encapsulation or may be formed with the appropriate contoured mold cap during the encapsulating process.

Yet another aspect of the present invention provides angled segment at the top or bottom or both at an insertion side of the integrated circuit package system. The angled segment help direct the integrated circuit package system during the insertion process. The angled segment may also help direct the electrical connection between the integrated circuit package system and the electronic system.

Yet another aspect of the present invention provides recess structures not being too obtrusive and allowing devices at both sides of the recess. This allows for increased device content in the integrated circuit package system.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system method of the present invention furnishes important and heretofore unknown and unavailable solutions, capabilities, and functional aspects for improving reliability in systems. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
   forming a substrate having a first surface and a second surface;
   mounting a first device over the first surface;
   forming an encapsulation having a planar top surface to cover the first device and the substrate spanning to an extraction side of the encapsulation;
   forming a recess in the encapsulation from the planar top surface next to the extraction side;
   mounting a second device on the first surface at a side of the recess opposite the first device; and
   forming a nonorthogonal lower segment with a portion of the second surface exposed at the insertion side.

2. The system as claimed in claim 1 wherein mounting the first device includes mounting a passive component.

3. The system as claimed in claim 1 wherein mounting the first device includes mounting an integrated circuit die.

4. The system as claimed in claim 1 wherein forming the first device includes forming a communication access device, a storage device, or an identity verification device.

5. An integrated circuit package system comprising:
   a substrate having a first surface and a second surface;
   a device over the substrate and attached to the first surface;
   an encapsulation, having a planar top surface and a recess from the planar top surface, comprised of a mold resin to cover the device and the substrate spanning to an extraction side of the encapsulation;
   a second device on the first surface at a side of the recess opposite the device; and further comprising:
   a nonorthogonal lower segment with a portion of the second surface exposed at the insertion side.

6. The system as claimed in claim 5 wherein the device is a passive component.

7. The system as claimed in claim 5 wherein the device is an integrated circuit die.

8. The system as claimed in claim 5 wherein the device is a communication access device, a storage device, or an identity verification device.

* * * * *